(12) United States Patent
Takei et al.

(10) Patent No.: US 11,258,286 B2
(45) Date of Patent: Feb. 22, 2022

(54) POWER SUPPLY DEVICE

(71) Applicant: Ricoh Company, Ltd., Tokyo (JP)

(72) Inventors: Teruyuki Takei, Tokyo (JP); Yoshitaka Kimura, Tokyo (JP); Takahiro Suzuki, Tokyo (JP); Naoto Asakura, Tokyo (JP)

(73) Assignee: RICOH COMPANY, LTD., Tokyo (JP)

(*) Notice: Subject to any disclaimer, the term of this patent is extended or adjusted under 35 U.S.C. 154(b) by 223 days.

(21) Appl. No.: 16/351,561

(22) Filed: Mar. 13, 2019

(65) Prior Publication Data
US 2019/0288519 A1 Sep. 19, 2019

(30) Foreign Application Priority Data
Mar. 16, 2018 (JP) .............................. JP2018-049301

(51) Int. Cl.
*H02J 7/00* (2006.01)
*G01R 31/382* (2019.01)

(52) U.S. Cl.
CPC ............ *H02J 7/007* (2013.01); *G01R 31/382* (2019.01); *H02J 7/00* (2013.01)

(58) Field of Classification Search
CPC . H02J 7/007; H02J 7/00; H02J 7/0063; G01R 31/382; Y02B 70/3225; Y04S 20/222; Y02D 10/00; G06F 1/305; G06F 1/3212; G06F 1/3215; G06F 1/3296; G06F 1/266; G06F 1/28
See application file for complete search history.

(56) References Cited

U.S. PATENT DOCUMENTS

| | | | |
|---|---|---|---|
| 10,587,113 B2* | 3/2020 | Morii | ........................ H02H 9/02 |
| 2012/0044405 A1 | 2/2012 | Kimura et al. | |
| 2012/0086824 A1 | 4/2012 | Asakura et al. | |
| 2012/0310564 A1* | 12/2012 | Yamamoto | ............. G01R 31/36 |
| | | | 702/63 |
| 2013/0057716 A1 | 3/2013 | Asakura | |
| 2013/0201390 A1 | 8/2013 | Asakura et al. | |
| 2015/0268688 A1* | 9/2015 | Leinonen | ............... G06F 13/409 |
| | | | 307/147 |
| 2017/0163074 A1 | 6/2017 | Kimura | |
| 2017/0293333 A1* | 10/2017 | Liu | ...................... G06F 13/4282 |
| 2017/0366028 A1* | 12/2017 | Nicholson | ............... H04L 12/10 |
| 2018/0004277 A1* | 1/2018 | Matsui | ................... G06F 1/3287 |

(Continued)

FOREIGN PATENT DOCUMENTS

| JP | 2014-003835 A | 1/2014 |
|---|---|---|
| JP | 2018-007451 | 1/2018 |

OTHER PUBLICATIONS

Office Action dated Nov. 2, 2021 in Japanese Patent Application No. 2018-049301, 6 pages.

*Primary Examiner* — Nha T Nguyen
(74) *Attorney, Agent, or Firm* — Xsensus LLP

(57) ABSTRACT

A power supply device includes a battery and processing circuitry. The processing circuitry is configured to estimate a tendency of consumption of the battery and put the power supply device into one of a first state in which the power supply device can supply electric power to another device and a second state in which the power supply device can receive electric power from said another device, in accordance with the tendency of consumption of the battery estimated.

8 Claims, 6 Drawing Sheets

(56) References Cited

U.S. PATENT DOCUMENTS

| | | |
|---|---|---|
| 2018/0060261 A1* | 3/2018 | Chhor ................ G06F 13/4282 |
| 2018/0070034 A1 | 3/2018 | Kimura |
| 2018/0241926 A1 | 8/2018 | Nishimura et al. |

* cited by examiner

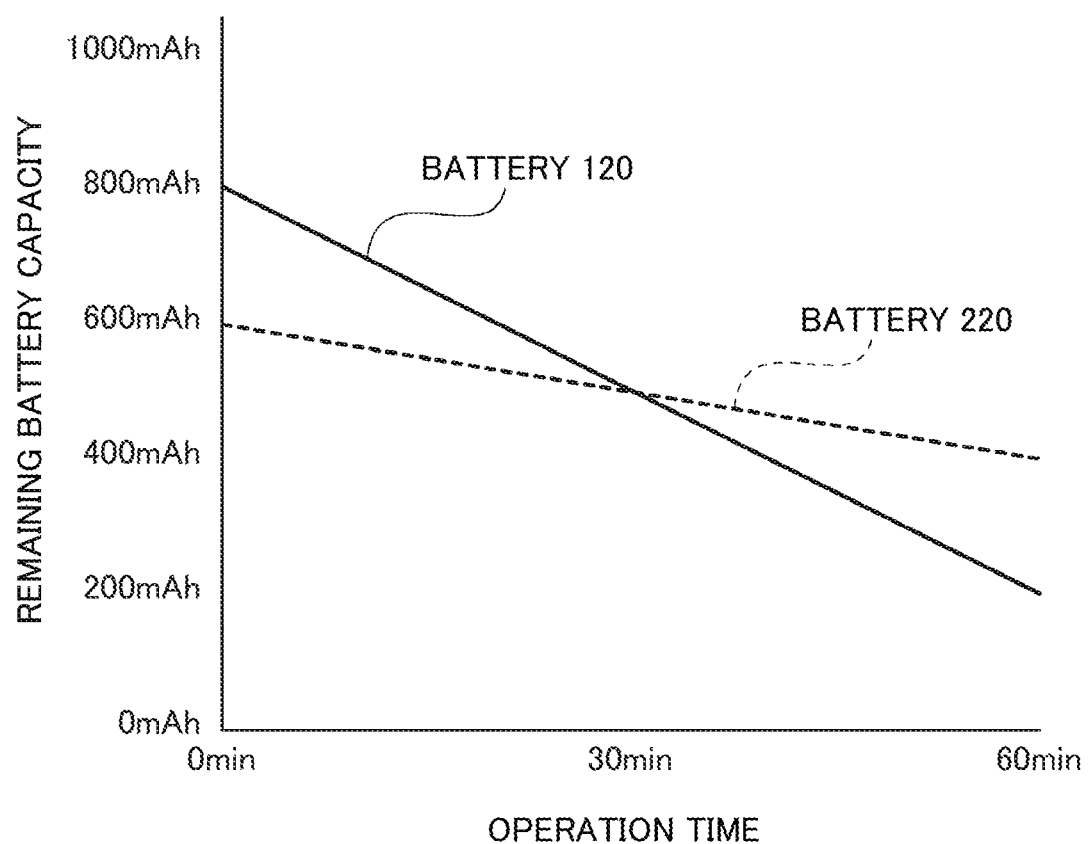

POWER SUPPLY DEVICE

CROSS-REFERENCE TO RELATED APPLICATIONS

This patent application is based on and claims priority pursuant to 35 U.S.C. § 119(a) to Japanese Patent Application No. 2018-049301, filed on Mar. 16, 2018, in the Japan Patent Office, the entire disclosure of which is hereby incorporated by reference herein.

BACKGROUND

Technical Field

The present disclosure relates to a power supply device.

Description of the Background Art

Power supply devices compliant with universal serial bus power delivery (USB-PD) are known.

Such a power supply device is a dual-role power (DRP) device having a DRP port that enables selective supply and reception of electric power, and includes configuration channel (cc) terminals for recognizing connection between devices.

A cc terminal is selectively connected to a pull-up resistor or a pull-down resistor. In each DRP device, the cc1 terminal is periodically and alternately connected to the pull-up resistor or the pull-down resistor Rd1. Accordingly, according to the timing at which DRP devices are connected to each other via a universal serial bus (USB) cable, one of the DRP devices is set to be a source (which is a port to supply power and has a cc terminal connected to the pull-up terminal) and the other of the DRP devices is set to be a sink (which is a port to receive power and has a cc terminal connected to the pull-down terminal).

When the DRP devices are connected to each other, the direction of power transmission between the DRP devices may be set to be a direction opposite a direction intended by the user, depending on the connection timing (in other words, a state of the cc terminal of each DRP device at the time of connection). Hence, for example, a DRP device is configured to display on a display screen that the DRP device is in a power supplying state or a power receiving state, and switch the power supplying state and the power receiving state in response to a touch operation on the display screen. Accordingly, when the user checks the display screen and the direction of power transmission between the DRP devices is opposite the direction intended by the user, the user can touch the display screen to switch the direction of power transmission to the intended direction.

SUMMARY

In an aspect of the present disclosure, there is provided a power supply device that includes a battery and processing circuitry. The processing circuitry is configured to estimate a tendency of consumption of the battery and put the power supply device into one of a first state in which the power supply device can supply electric power to another device and a second state in which the power supply device can receive electric power from said another device, in accordance with the tendency of consumption of the battery estimated.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 4 is a graph for complementing explanation of a process to be performed by a device to estimate a tendency of consumption of a battery in the first embodiment of the present disclosure;

Figure 1:
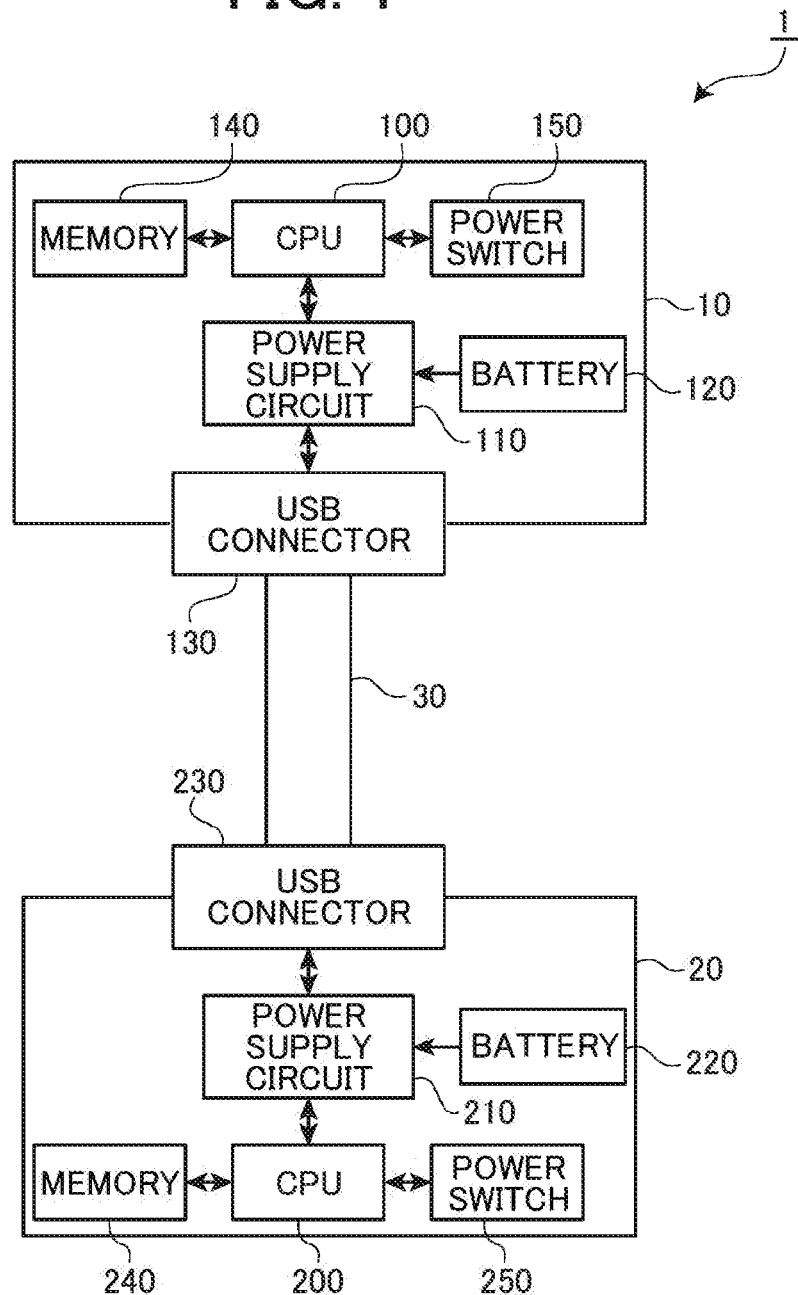
FIG. 1 is a block diagram illustrating the configuration of a power supply system according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

The following is a description of a power supply system according to an embodiment of the present disclosure, with reference to the accompanying drawings.

FIG. 1 is a block diagram illustrating the configuration of a power supply system 1 according to an embodiment of the present disclosure. The power supply system 1 includes at least two devices (power supply devices). In the example illustrated in FIG. 1, the power supply system 1 includes a device 10 and a device 20.

The devices 10 and 20 constituting the power supply system 1 can supply and receive electric power in accordance with results of communication between the devices. That is, the devices 10 and 20 are operable as power supply devices, and are an example of DRP devices each having a DRP port compatible with a USB-PD.

Specific examples of the devices 10 and 20 include digital single-lens reflex cameras, mirrorless interchangeable lens cameras, compact digital cameras, video cameras, surveillance cameras, camcorders, desktop PCs, notebook PCs, tablet terminals, personal handy phone systems (PHSs), smartphones, smart watches, feature phones, game machines, music players, television receivers, mobile batteries, projectors, printers, various kinds of peripheral devices such as storages, strobes, GPS units, and various kinds of accessories such as external finders.

Being a DRP device, each of the devices 10 and 20 can be both a source and a sink. In the present embodiment, for the sake of convenience, device-specific components (such as the solid-state imaging elements and the imaging lens in a digital single-lens reflex camera, the monitor display and the HDD in a PC, and the flash lamp and the trigger circuit in a strobe), and general components such as housings that are not relevant herein will be neither illustrated in the drawings nor explained in detail.

As illustrated in FIG. 1, the device 10 includes a central processing unit (CPU) 100, a power supply circuit 110, a battery 120, a USB connector 130, a memory 140, and a power switch 150.

When the user presses the power switch 150, the power supply circuit 110 supplies power to the respective components of the device 10. The power supply source for the power supply circuit 110 is the battery 120 or a commercial power supply, for example. The device 10 operates basically with power supplied from the battery 120. However, when connected to a commercial power supply, the device 10 switches to an operation with power supplied from the commercial power supply.

The CPU 100 accesses the memory 140, reads out a control program, loads the control program into the work area, and executes the loaded control program, to comprehensively control the entire device 10.

The USB connector 130 is a connector compliant with the USB-PD standard, and is a USB Type-C connector, for example. One end of a USB cable 30 is connected to the USB connector 130. The USB cable 30 is a cable compliant with the USB-PD standard, and is a USB Type-C cable, for example.

As illustrated in FIG. 1, the device 20 includes a CPU 200, a power supply circuit 210, a battery 220, a USB connector 230, a memory 240, and a power switch 250. As for the device 20, the same components as the corresponding components of the device 10 will be briefly described or not described at all below, for the sake of convenience.

The USB connector 230 is a connector compliant with the USB-PD standard, and is a USB Type-C connector, for example. The other end of the USB cable 30 is connected to the USB connector 230.

The USB cable 30 includes power supply lines that are a VBUS line connecting a VBUS terminal of the device 10 and a VBUS terminal of the device 20, and a GND line connecting a GND terminal of the device 10 and a GND terminal of the device 20. The USB cable 30 also includes a configuration channel (cc) line for recognizing connection between the devices.

Figure 2:
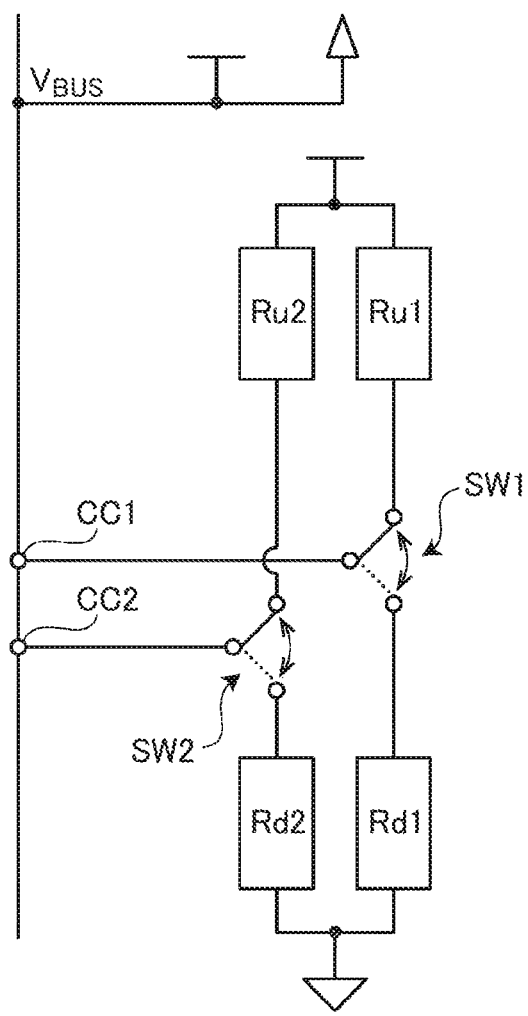
FIG. 2 is a diagram schematically illustrating the configuration around a connecting portion of a device provided in a power supply system according to an embodiment of the present disclosure.

FIG. 2 schematically illustrates the configuration around the connecting portion of the device 10 connected to the USB cable 30. Specifically, FIG. 2 illustrates the USB connector 130 and some circuits (for example, some circuits in the power supply circuit 110) in the device 10 located at the stage after the USB connector 130. It should be noted that the device 20, which is a DRP device, has the same configuration as the device 10 at the periphery of the connecting portion. Therefore, the periphery of the connecting portion of the device 20 is not illustrated in the drawings.

Being USB Type-C connectors, the USB connectors 130 and 230 are connecting portions that can be connected reversibly in two opposite directions (selectively in a first direction and a second direction). To enable reversible connection, each of the USB connectors 130 and 230 has a pair of cc terminals (a cc1 terminal and a cc2 terminal). When the USB connectors 130 and 230 are connected in one direction, the cc1 terminal of the device 10 and the cc1 terminal of the device 20 are connected via the USB cable 30 (a cc line), for example. When the USB connectors 130 and 230 are connected in the other direction, the cc2 terminal of the device 10 and the cc1 terminal of the device 20 are connected via the cc line, for example. Each of the devices 10 and 20 detects the direction of connection between the USB connectors 130 and 230, from the combination of the cc terminals connected via the cc line.

The cc1 terminal can be selectively connected to a pull-up resistor Ru1 or a pull-down resistor Rd1. The cc1 terminal is connected periodically and alternately to the pull-up resistor Ru1 and the pull-down resistor Rd1 by virtue of operation of a selector switch SW1 disposed between the pull-up resistor Ru1 and the pull-down resistor Rd1, while no electric power is supplied to or received from another USB-PD-compliant power supply device (while the device is not connected to another power supply device, for example). The cc2 terminal can also be selectively connected to a pull-up resistor Ru2 or a pull-down resistor Rd2 during the above period. The cc2 terminal is periodically and alternately connected to the pull-up resistor Ru2 and the pull-down resistor Rd2 by virtue of operation of a selector switch SW2 disposed between the pull-up resistor Ru2 and the pull-down resistor Rd2.

In each device, the connection between the cc terminals and the pull-up/pull-down resistor is periodically and alternately switched by the selector switch SW that operates as a switcher. Therefore, the source (that is the port that has the role of supplying electric power, and is the device having cc terminals connected to pull-up resistors at this point of time) and the sink (that is the port that has the role of receiving electric power, and is the device having cc terminals connected to pull-down resistors at this point of time) are determined in accordance with the timing at which the device 10 and the device 20 are connected via the USB cable 30.

In addition to that, when the devices are connected to each other via the cc line, the potential of the cc terminals changes due to voltage dividing by the pull-up resistor and the pull-down resistor of each device. As a result, the device 10 and the device 20 detect connection to each other, and stop the switching operation of each selector switch SW. That is, the device determined to be the source maintains the state in which the cc terminals are connected to the pull-up resistors, and the device determined to be the sink maintains the state in which the cc terminals are connected to the pull-down resistors.

When the device 10 and the device 20 detect connection of each other, a power supply voltage (5 V) is supplied from the source to the sink via the VBUS line. Negotiation is held between the source and the sink. Through this negotiation, one profile is selected from among a plurality of profiles (combinations of a voltage that can be supplied by the source and a maximum current), and the power supply voltage to be supplied via the VBUS line is changed from 5 V in accordance with the selected profile as necessary. When the negotiation is completed, the power supply voltage of 5 V or the changed power supply voltage is supplied from the source to the sink.

As described above, in a DRP device having a conventional configuration, in a case where the power transmission direction between DRP devices is determined to be the opposite of the direction intended by the user, the user needs to perform a switching operation with an operating unit, and switch the power transmission direction between the DRP devices to the direction intended by the user. On the other hand, the device 10 according to the present embodiment is designed so that the direction of power transmission to/from the device 20 is automatically set to the direction intended by the user, without the user of any operating unit.

<<First Embodiment>>

Figure 3:
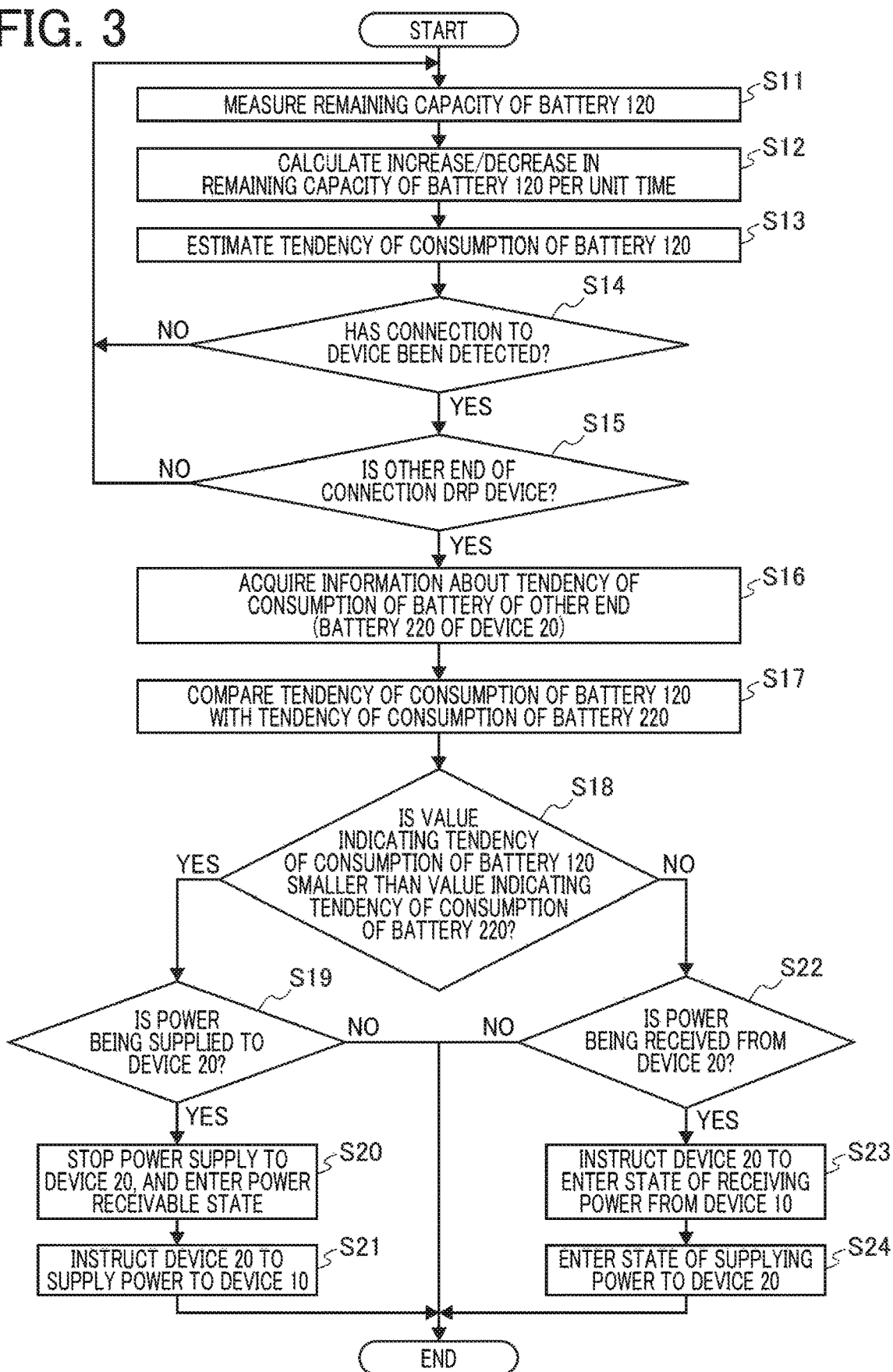
FIG. 3 is a flowchart relating to control to be performed by a device to control the direction of power transmission to/from the other end of connection in a first embodiment of the present disclosure.

FIG. 3 illustrates a flowchart relating to control to be performed by the device 10 (primarily the CPU 100) to control the direction of power transmission to/from the other end of the connection in a first embodiment of the present disclosure.

The CPU 100 operates as a measuring unit that measures the remaining capacity (unit: mAh, for example) of the battery 120 (step S11). In accordance with the measured remaining capacity of the battery 120, the CPU 100 also operates as a calculator that calculates the increase or decrease (unit: mAh/min, for example) in the remaining capacity per unit time (step S12). The remaining capacity of the battery 120 may be constantly measured, or may be periodically measured at predetermined time intervals. The increase or decrease in the remaining capacity of the battery 120 per unit time may also be constantly calculated, or may be periodically calculated at predetermined time intervals.

The memory 140 stores information about the remaining capacity of the battery 120 and the increase or decrease in the remaining capacity per unit time in the past certain period (or the transition of the remaining capacity of the battery 120 in the past certain period). The information beyond the certain period is not stored in the memory 140, and the old information is sequentially deleted. The information about the remaining capacity of the battery 120 and the increase or decrease in the remaining capacity per unit time in the past certain period may be deleted from the memory 140 when the battery 120 is fully charged, for example.

The CPU 100 operates as an estimator that estimates the tendency of consumption of the battery 120. In accordance with the latest remaining capacity of the battery 120 measured in step S11 and the increase or decrease in the remaining capacity of the battery 120 per unit time calculated in step S12, the CPU 100 estimates the tendency of consumption of the battery 120 (step S13). In this estimation process, the increase or decrease in the remaining capacity of the battery 120 per unit time during a predetermined period (the most recent period having a certain length) (the increase or decrease herein is a value obtained by averaging the increase or decrease during the respective unit times in the predetermined period, and will be hereinafter referred to as the "change in the remaining capacity") is calculated, and the tendency of consumption of the battery 120 is determined in accordance with the calculated change in the remaining capacity during the predetermined period and the latest remaining capacity of the battery 120. In an example case, the tendency of consumption of the battery 120 is indicated by an expected time until the remaining capacity of the battery 120 becomes zero, and is obtained by dividing the remaining capacity of the battery 120 by the change in the remaining capacity during the predetermined period.

The memory 140 is capable of storing a predetermined amount of information about the tendency of consumption of the battery 120. Information about the tendency of consumption of the battery 120 exceeding the predetermined amount is not stored in the memory 140, and the old information is sequentially deleted. The information about the tendency of consumption of the battery 120 may be deleted from the memory 140 when the battery 120 is fully charged, for example.

To estimate the tendency of consumption of the battery 120, at least the transition of the remaining capacity of the battery 120 should be obtained. To reduce the required memory capacity, the memory 140 may store the time elapsed since full charge and the slope of the remaining capacity per unit time, instead of the remaining capacity of the battery 120 and the increase or decrease in the remaining capacity per unit time.

As described above, when USB-PD-compliant devices are connected via the cc line, the potential of the cc terminals changes due to voltage dividing by the pull-up resistor and the pull-down resistor of each device. From this change, the CPU 100 detects the connection to the other end (step S14: YES), and determines the device 10 to be the source or the sink in accordance with the timing of the connection (in other words, from the states of the cc1 terminal and the cc2 terminal).

The CPU 100 determines whether the other end of the connection is a DRP device (step S15). If the other end of the connection is determined to be a DRP device (step S15: YES), the process in step S16 and the subsequent steps is performed. The description will be continued on the assumption that the device 20 is connected to the device 10.

The same process as steps S11 through S13 is also performed in the device 20. That is, the device 20 measures the remaining capacity of the battery 220, calculates the increase or decrease in the remaining capacity of the battery 220 per unit time, and estimates the tendency of consumption of the battery 220.

The CPU 100 operates as a setting unit that sets the device 10 as the source or the sink in accordance with the tendency of consumption of the battery 120.

The CPU 100 communicates with the device 20, to acquire information about the tendency of consumption of the battery 220 (step S16). The CPU 100 compares the tendency of consumption of the battery 120 estimated in step S13 with the tendency of consumption of the battery 220 acquired in step S16 (step S17), and determines whether the value indicating the tendency of consumption of the battery 120 is smaller than the value indicating the tendency of consumption of the battery 220 (step S18). That is, the CPU 100 determines whether the expected time until the remaining capacity of the battery 120 becomes zero is shorter than the expected time until the remaining capacity of the battery 120 becomes zero.

Referring now to FIG. 4, a process of estimating the tendency of consumption of a battery is supplementarily described. FIG. 4 illustrates a graph in which the remaining capacity (unit: mAh) of the battery is plotted on the ordinate axis, and the operation time (unit: min) of the battery is plotted on the abscissa axis.

In the example illustrated in FIG. 4, the remaining capacity of the battery at the time when the battery operation time is 60 min is divided by the change in the remaining capacity during a predetermined period (in the period from 0 min to 60 min), so that the tendency of consumption of each of the batteries 120 and 220 is determined. Specifically, the remaining capacity of the battery 120 decreases from 800 mAh to 200 mAh in 60 minutes. Accordingly, the tendency of consumption (the expected time until the remaining capacity becomes zero) of the battery 120 is 20 minutes. On the other hand, the remaining capacity of the battery 220 decreases from 600 mAh to 400 mAh in 60 minutes. Accordingly, the tendency of consumption (the expected time until the remaining capacity becomes zero) of the battery 220 is 120 minutes.

In a case where the value indicating the tendency of consumption of the battery 120 is smaller than the value indicating the tendency of consumption of the battery 220 (step S18: YES), there is a high possibility that the remaining capacity of the battery 120 becomes zero first. As is visually apparent from FIG. 4, the remaining capacity of the battery 120 (indicated by a solid line) is likely to be zero more quickly than the remaining capacity of the battery 220 (indicated by a dashed line). In this case, electric power is supplied to the device 10 from the device 20 having a long time left before the remaining capacity of the battery becomes zero, so that power reception control according to the user's intention is performed.

Therefore, the CPU 100 determines whether electric power is being supplied to the device 20 (or whether the device 10 is the source) (step S19). If the CPU 100 determines that electric power is being supplied to the device 20 (step S19: YES), the CPU 100 switches the cc terminals connected to the cc line from the pull-up resistors to the pull-down resistors to stop the power supply to the device 20, and enters a power receivable state (or a state in which the device 10 can operate as the sink) (step S20).

The CPU 100 then outputs a control signal to the device 20 so that the device 20 supplies electric power to the device 10 (or the device 20 operates as the source) (step S21). As a result, the power transmission direction is changed to the direction from the device 20 having a long time left before the remaining capacity of the battery becomes zero toward the device 10, so that the power reception control according to the user's intention is performed.

If the CPU 100 determines that electric power is being received from the device 20 (step S19: NO), on the other hand, electric power is being supplied to the device 10 from the device 20 having a long time left before the remaining capacity of the battery becomes zero, and the power reception control according to the user's intention is already being performed. Therefore, the CPU 100 ends the process illustrated in this flowchart, without changing the power transmission direction.

In a case where the value indicating the tendency of consumption of the battery 120 is equal to or greater than the value indicating the tendency of consumption of the battery 220 (step S18: NO), there is a high possibility that the remaining capacity of the battery 220 becomes zero first. In this case, electric power is supplied to the device 20 from the device 10 having a long time left before the remaining capacity of the battery becomes zero, so that power reception control according to the user's intention is performed.

Therefore, the CPU 100 determines whether electric power is being received from the device 20 (or whether the device 10 is the sink) (step S22). If the CPU 100 determines that electric power is being received from the device 20 (step S22: YES), the CPU 100 outputs a control signal to the device 20 so as to enter a state of receiving electric power from the device 10 (or the device 20 operates as the sink) (step S23).

The CPU 100 then switches the cc terminals connected to the cc line from the pull-down resistors to the pull-up resistors, to enter a state in which the device 10 can supply electric power (or a state in which the device 10 can operate as the source) (step S24). As a result, the power transmission direction is changed to the direction from the device 10 having a long time left before the remaining capacity of the battery becomes zero toward the device 20, so that the power reception control according to the user's intention is performed.

If the CPU 100 determines that electric power is being supplied to the device 20 (step S22: NO), on the other hand, electric power is being supplied to the device 20 from the device 10 having a long time left before the remaining capacity of the battery becomes zero, and the power reception control according to the user's intention is already being performed. Therefore, the CPU 100 ends the process illustrated in this flowchart, without changing the power transmission direction.

As described above, in the first embodiment, the direction of power transmission to/from the other end of connection is automatically set to the direction intended by the user, without the use of any operating unit. Furthermore, in the first embodiment, to set the direction of power transmission to/from the other end of connection to the direction intended by the user, there is no need to prepare a display unit such as a display screen.

In the first embodiment, the remaining capacity of the battery 120 at the time of connection to the device 20 (or the latest remaining capacity of the battery 120) is divided by the change in remaining capacity during the latest period having a certain length, so that the tendency of consumption of the battery 120 is determined. However, the tendency of consumption of the battery 120 may be determined by some other method. Referring now to FIGS. 5A through 5G, other methods of determining the tendency of consumption of the battery 120 are described. In each of the graphs illustrated in FIGS. 5A through 5G, the remaining capacity (unit: mAh) of the battery 120 is plotted on the ordinate axis, and the operation time (unit: min) of the battery 120 is plotted on the abscissa axis.

Figure 5A:
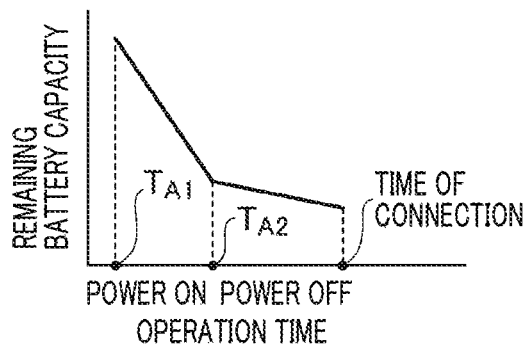
FIGS. 5A through 5G are graphs for explaining how a device determines a tendency of battery consumption in modifications of the present disclosure.

Modification A (FIG. 5A)

In the first embodiment described above, the device 20 is connected to the device 10 while the power supply to the device 10 is on. In this modification A, however, the device 20 is connected to the device 10 while the power supply to the device 10 is off. As illustrated in FIG. 5A, the change (represented by the absolute value of the slope in FIG. 4) in the remaining capacity of the battery 120 is small during the power-off period. In this case, the tendency of consumption of the battery 120 is calculated to be a large value (or a time during which the expected time until the remaining capacity becomes zero is long) is calculated, and, as a result of the process in steps S17 through S24, the device 10 is easily set as the source. However, if the device 10 is set as the source when the remaining capacity of the battery 120 is small at the time of connection to the device 20, there is a possibility that electric power cannot be promptly supplied to the device 20 due to the insufficient remaining capacity.

Therefore, in this modification A, when determining that the device 20 is connected to the device 10, the CPU 100 detects the on/off state of the power supply to the device 10 at the time when the device 20 is connected. When detecting that the power supply is off, the CPU 100 sets a target period that is the period from the last time when the power supply is turned on (a point of time TA2 in FIG. 5A) back to a time point that is a predetermined time earlier (a point of time TA1 in FIG. 5A), and calculates the change in the remaining capacity of the battery 120 during the set target period (the period from the point of time TA1 to the point of time TA2, during which the power supply is on). The CPU 100 then divides the remaining capacity of the battery 120 at the most recent power-on time point (the point of time TA2), not at the time of connection to the device 20, by the calculated change in the remaining capacity, to determine the tendency of consumption of the battery 120. Thus, it becomes possible to avoid the inconvenience that the tendency of consumption of the battery 120 is calculated to be an unreasonably great value.

Figure 5B:
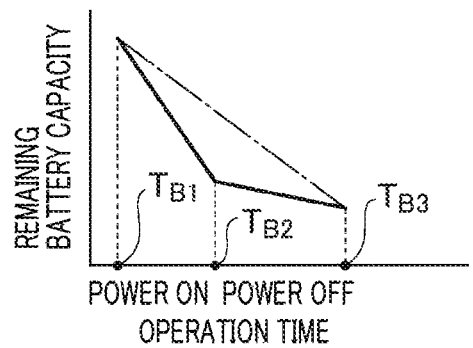

Modification B (FIG. 5B)

In this modification B, the device 20 is also connected to the device 10 while the power supply to the device 10 is off. In a case where the remaining capacity of the battery 120 is equal to or larger than a predetermined capacity at the time of connection to the device 20, even if the device 10 is set as the source, the possibility that the device 10 immediately becomes unable to supply electric power to the device 20 is low.

Therefore, in this modification B, when determining that the device 20 is connected to the device 10, the CPU 100 detects the on/off state of the power supply to the device 10 at the time when the device 20 is connected, as in the modification A. When detecting that the power supply is off, the CPU 100 determines whether the remaining capacity of the battery 120 is equal to or larger than the predetermined capacity. If the CPU 100 determines that the remaining capacity of the battery 120 is equal to or larger than the predetermined capacity, the CPU 100 sets a target period that is the period from the point of time of connection to the device 20 (a point of time TB3 in FIG. 5B) back to a time point that is a predetermined time earlier (a point of time TB1 in FIG. 5B), and calculates the change in the remaining capacity of the battery 120 (see a dot-and-dash line in FIG. 5B) during the set target period (the period including the period from the point of time TB1 to a point of time TB2, during which the power supply is on, and the period from the point of time TB2 to the point of time TB3, during which the power supply is off). The CPU 100 then divides the remaining capacity of the battery 120 at the point of time of connection to the device 20 (the point of time TB3) by the calculated change in the remaining capacity, to determine the tendency of consumption of the battery 120.

If the remaining capacity of the battery 120 is less than the predetermined capacity at the time of connection to the device 20 (the point of time TB3), on the other hand, the CPU 100 divides the remaining capacity of the battery 120 at the last time the power supply is turned on (the point of time TB2 in FIG. 5B) by the change in the remaining capacity of the battery 120 during the period from the point of time TB1 to the point of time TB2, during which the power supply is on, to determine the tendency of consumption of the battery 120, as in the above described modification A.

Figure 5C:
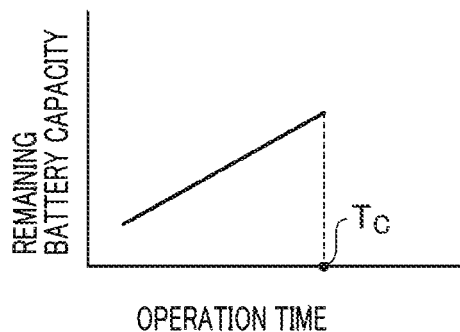

Modification C (FIG. 5C)

In this modification C, the device 20 is connected to the device 10 while the power supply to the device 10 is on. In this modification C, in a case where the increase or decrease in the remaining capacity of the battery 120 per unit time at the point of time of connection to the device 20 (a point of time TC in FIG. 5C) exceeds zero (that is, while the battery 120 is being charged), the device 10 is set as the source by the device 20, regardless of the tendency of consumption of each of the batteries 120 and 220.

Figure 5D:
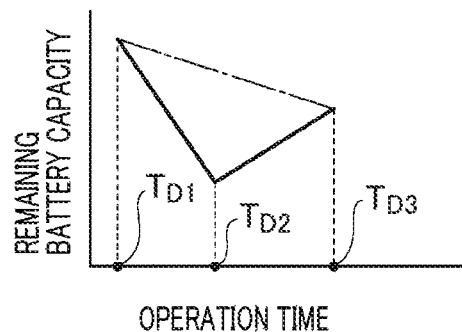

Modification D (FIG. 5D)

In this modification D, the device 20 is connected to the device 10 while the power supply to the device 10 is on. If the device 10 is set as the source in a case where the remaining capacity of the battery 120 is small at the point of time of connection to the device 20, there is a possibility that electric power cannot be promptly supplied to the device 20 even when the battery 120 is being charged (during the period in which the change in the remaining capacity of the battery 120 exceeds zero).

Therefore, in this modification D, in a case where the remaining capacity of the battery 120 is less than a predetermined capacity at the point of time of connection to the device 20 (a point of time TD3 in FIG. 5D), the CPU 100 sets a target period that is the period from a point of time immediately before the battery 120 is charged (a point of time TD2 in FIG. 5D) back to a time point that is a predetermined time earlier (a point of time TD1 in FIG. 5D), and calculates the change in the remaining capacity of the battery 120 during the set target period (the period from the point of time TD1 to the point of time TD2, which is a discharging period). The CPU 100 then divides the remaining capacity of the battery 120 at the point of time immediately before the battery 120 is charged (the point of time TD2) by the calculated change in the remaining capacity, to determine the tendency of consumption of the battery 120. That is, in determining the tendency of consumption of the battery 120, the charging period (from the point of time TD2 to the point of time TD3 in FIG. 5D) is not taken into account.

In a case where the remaining capacity of the battery 120 is equal to or larger than the predetermined capacity at the point of time of connection to the device 20 (the point of time TD3), on the other hand, the CPU 100 sets a target period that is the period from the point of time of connection to the device 20 back to a time point that is the predetermined time earlier (the point of time TD1), and calculates the change in the remaining capacity (see a dot-and-dash line in FIG. 5D) of the battery 120 during the set target period (a period including the period from the point of time TD1 to the point of time TD2, which is a discharging period, and the period from the point of time TD2 to the point of time TD3, which is a charging period). The CPU 100 then divides the remaining capacity of the battery 120 at the point of time of connection to the device 20 (the point of time TD3) by the calculated change in the remaining capacity, to determine the tendency of consumption of the battery 120. That is, the CPU 100 determines the tendency of consumption of the battery 120, taking into account both the charging period and the discharging period of the battery 120.

Figure 5E:
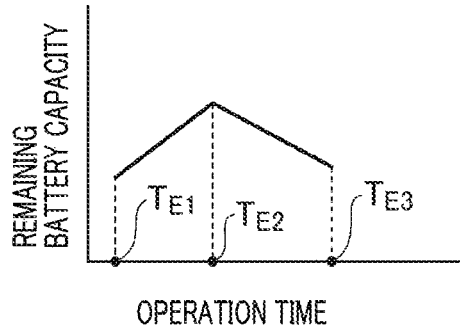

Modification E (FIG. 5E)

In this modification E, the device 20 is connected to the device 10 while the power supply to the device 10 is on. In this modification E, a charging period (from a point of time TE2 to a point of time TE3 in FIG. 5E) before a discharging period (from a point of time TE1 to the point of time TE2 in FIG. 5E) is not taken into account. That is, in this modification E, the CPU 100 sets a target period that is the period from the point of time of connection to the device 20 (the point of time TE3 in FIG. 5E) to the point of time of a discharging start (the point of time TE2 in FIG. 5E), and calculates the change in the remaining capacity of the battery 120 during the set target period (the period from the point of time TE2 to the point of time TE3, which is the discharging period). The CPU 100 then divides the remaining capacity of the battery 120 at the point of time of connection to the device 20 (the point of time TE3) by the calculated change in the remaining capacity, to determine the tendency of consumption of the battery 120.

Figure 5F:
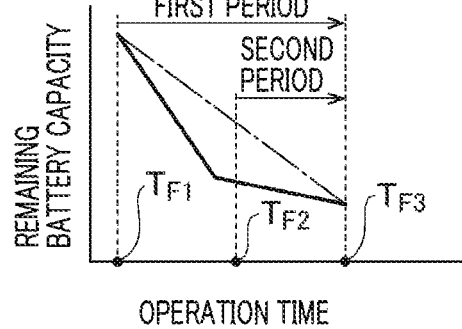

Modification F (FIG. 5F)

In this modification F, the device 20 is connected to the device 10 while the power supply to the device 10 is on. More specifically, in this modification F, the tendency of consumption of the battery 120 during a first period (or the value obtained by dividing the remaining capacity of the battery 120 at the point of time of connection to the device 20 (a point of time TF3 in FIG. 5F) by the change in the remaining capacity (see a dot-and-dash line in FIG. 5F) of the battery 120 during the period from a point of time TF1 to the point of time TF3) is assumed to have the same value as the tendency of consumption of the battery 220 during the first period. In this case, the tendency of consumption of the battery 120 during a second period (or the value obtained by dividing the remaining capacity of the battery 120 at the point of time of connection to the device 20 (the point of time TF3) by the change in the remaining capacity during the period from the point of time TF2 to the point of time TF3) is calculated, and is compared with the tendency of consumption of the battery 220 during the second period. That is, the period during which the tendency of consumption of the battery 120 is the same as the tendency of consumption of the battery 220 is not taken into account, and a process of comparison with the tendency of consumption of the battery 220 is performed during a period closer to the current time.

Figure 5G:
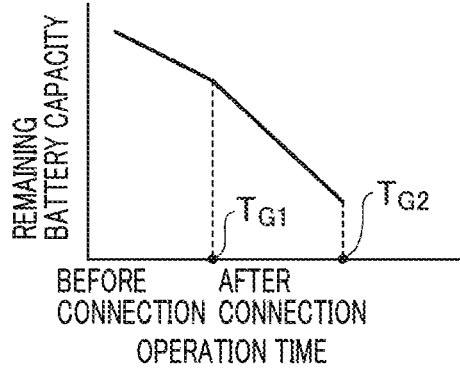

Modification G (FIG. 5G)

In this modification G, the device 20 is connected to the device 10 while the power supply to the device 10 is on. In this modification G, the remaining capacity of the battery 120 not at a point of time of connection to the device 20 (a point of time TG1 in FIG. 5G) but at a point of time (a point of time TG2 in FIG. 5G) at which a certain period has passed since the point of time of the connection is divided by the change in the remaining capacity during the certain period (from the point of time TG1 to the point of time TG2), so that the tendency of consumption of the battery 120 is determined. In the device 20, the remaining capacity of the battery 220 at a point of time (the point of time TG2 in FIG. 5G) at which a certain period has passed since the point of time of the connection to the device 10 (the point of time TG1 in FIG. 5G) is divided by the change in the remaining capacity during the certain period (from the point of time TG1 to the point of time TG2), so that the tendency of consumption of the battery 220 is determined.

As described above, in this modification G, the tendency of consumption of each of the batteries 120 and 220 is determined, with the charged state and the power consumption state of each other (the device 10 or the device 20) after the connection being taken into account. A process of comparing the consumption tendencies with each other is then performed. In an example case, the device with the larger battery capacity is more likely to be set as the source.

Other Modifications

To reduce the processing load on the CPU 100 in step S13, the CPU 100 may divide the remaining capacity of the battery 120 at the latest point of time (the point of time of connection to the device 20, for example) by the increase or decrease in the remaining capacity of the battery 120 per unit time at the latest point of time, to easily determine the tendency of consumption of the battery 120.

The CPU 100 may determine the tendency of consumption of the battery 120, using the change in the remaining capacity during the period from the point of time of full charge to the current time, for example, instead of the change in the remaining value during the most recent period having a certain length.

The device 10 may be designed to be operable in a plurality of modes. In this case, the CPU 100 may determine the tendency of consumption of the battery 120, using the change in the remaining capacity during the period from the time of the latest mode change to the current time, for example.

The device 10 may be designed to enter a power saving mode with less power consumption, when the remaining capacity of the battery 120 becomes equal to or less than a predetermined threshold. In this case, the change in the remaining capacity (the absolute value of the slope in FIG. 4) of the battery 120 is small in the power saving mode. In this case, the tendency of consumption of the battery 120 is calculated to be a large value (or a time during which the expected time until the remaining capacity becomes zero is long) is calculated, and, as a result of the process in steps S17 through S24, the device 10 is easily set as the source. However, if the device 10 is set as the source when the remaining capacity of the battery 120 is small at the time of connection to the device 20, there is a possibility that electric power cannot be promptly supplied to the device 20 due to the insufficient remaining capacity. Therefore, when the tendency of consumption of the battery 120 is to be determined, the change in the remaining capacity of the battery 120 may be multiplied by a coefficient (a coefficient greater than 1). Thus, it becomes possible to avoid the inconvenience that the tendency of consumption of the battery 120 is calculated to be an unreasonably great value.

<<Second Embodiment>>

Figure 6:
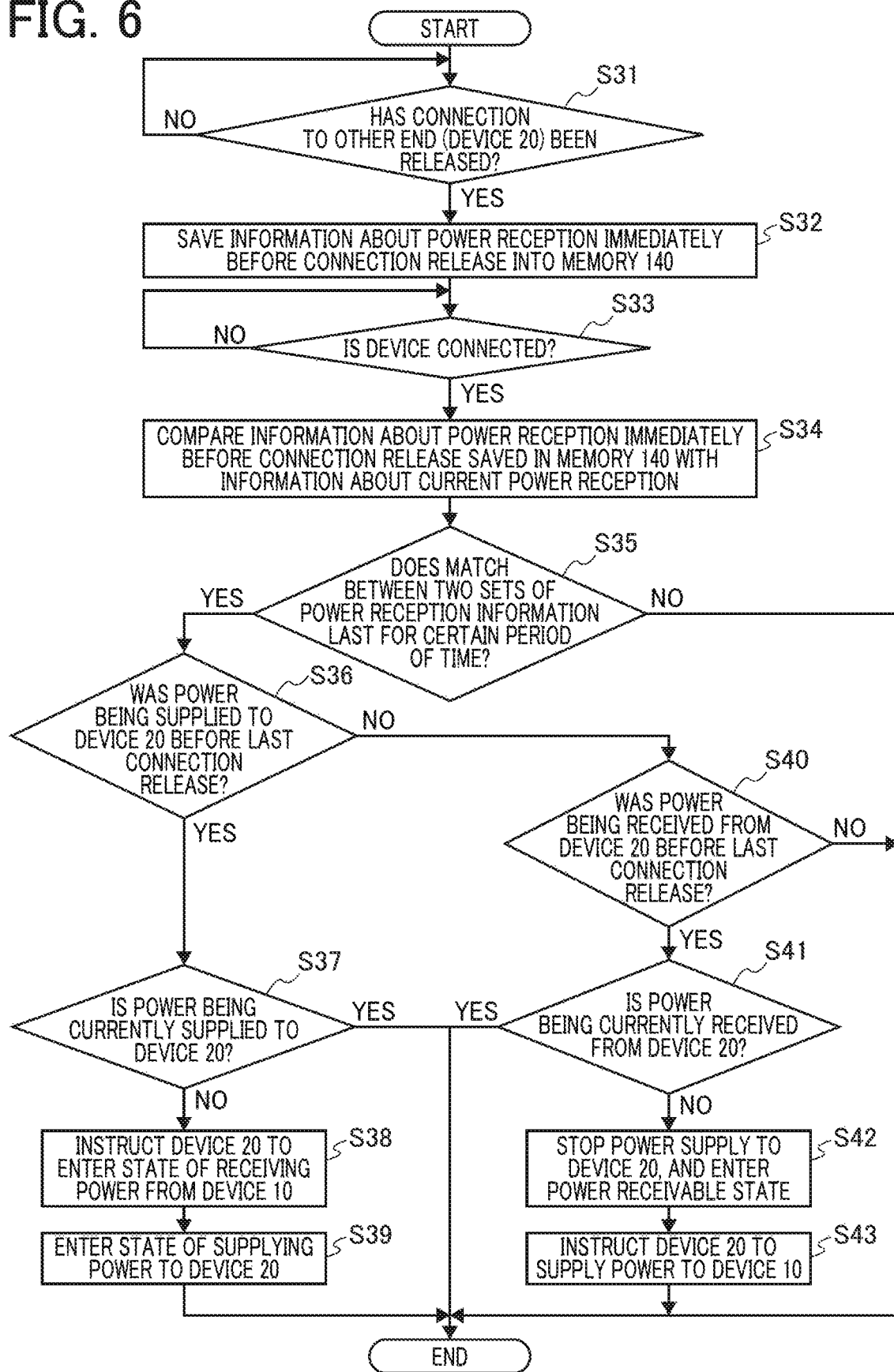
FIG. 6 is a flowchart relating to control to be performed by a device to control the direction of power transmission to/from the other end of connection in a second embodiment of the present disclosure.

FIG. 6 illustrates a flowchart relating to control to be performed by the device 10 (primarily the CPU 100) to control the direction of power transmission to/from the other end of the connection in a second embodiment of the present disclosure. At the start of the flowchart of the second embodiment, the device 20 is connected to the device 10.

The CPU 100 determines whether the connection to the device 20 has been released (step S31). While the device 10 is connected to the device 20, the CPU 100 monitors information about power reception (the current being supplied to the device 20 in a case where the device 10 is the source, and the current being received from the device 20 in a case where the device 10 is the sink). If the CPU 100 determines that the connection to the device 20 has been released (step S31: YES), the CPU 100 saves the power reception information (the value of the current supplied to the device 20 or the value of the current received from the device 20) immediately before the connection release into the memory 140 (step S32).

The CPU 100 determines whether the other end is connected (step S33). If the other end is connected, the process illustrated in the flowchart in FIG. 3 is performed, for example, so that one of the devices is set as the source, and the other one is set as the sink. If the CPU 100 determines that the other end is connected (step S33: YES), the CPU 100 compares the information about the power reception immediately before the release of the connection to the device 20 saved in the memory 140 in step S32 with the information about the current power reception information (the current supplied to the other end in a case where the device 10 is the source, and the current received from the other end in a case where the device 10 is the sink) (step S34), and determines whether the two sets of power reception information match for a certain period of time (step S35).

If the two devices continue to have the same power reception information for a certain period (step S35: YES), there is a high possibility that the same device as the previous device (the device 20 in this case) is reconnected. In this case, the process in step S36 and the subsequent steps is performed. If the two devices do not have the same power reception information at least during part of the period (step S35: NO), there is a high possibility that a device different from the previous one is connected. In this case, the process illustrated in this flowchart comes to an end.

If the CPU 100 determines that the two devices continuously have the same power reception information for a certain period (step S35: YES), the CPU 100 operates on the assumption that the device 20 is reconnected.

In this manner, the CPU 100 operates as a determiner that determines whether the same device as the previous one is reconnected.

The CPU 100 determines whether the device 10 was operating as the source before the connection to the device 20 was released last time (step S36). If the CPU 100 determines that the device 10 was operating as the source before the connection to the device 20 was released last time (step S36: YES), the CPU 100 determines whether the device 10 is currently operating as the source, or whether the device 10 is supplying electric power to the device 20 (step S37).

In the second embodiment, in a case where the same device as the previous one is connected, maintaining the same power transmission direction as the previous one is the power reception control according to the user's intention. Therefore, if the CPU 100 determines that the device 10 is currently operating as the source (step S37: YES), the CPU 100 ends the process illustrated in this flowchart, because the power reception control according to the user's intention has already been performed.

If the CPU 100 determines that the device 10 is not currently operating as the source (or is currently operating as the sink) (step S37: NO), the power reception control according to the user's intention has not been performed, and therefore, the CPU 100 outputs a control signal to the device 20 to enter a state of receiving electric power from the device 10 (or so that the device 20 operates as the sink) (step S38). The CPU 100 then switches the cc terminals connected to the cc line from the pull-down resistors to the pull-up resistors, to enter a state in which the device 10 can supply electric power (or a state in which the device 10 can operate as the source) (step S39). As a result, the power transmission direction is changed to the same direction as the previous direction (the direction from the device 10 toward the device 20), so that the power reception control according to the user's intention is performed.

If the CPU 100 determines that the device 10 was not operating as the source before the connection to the device 20 was released last time (step S36: NO), the CPU 100 determines whether the device 10 was operating as the sink before the connection to the device 20 was released last time (step S40).

If the CPU 100 determines that the device 10 was operating as the sink before the connection to the device 20 was released last time (step S40: YES), the CPU 100 determines whether the device 10 is currently operating as the sink, or whether the device 10 is receiving electric power from the device 20 (step S41). If the CPU 100 determines that the device 10 is currently operating as the sink (step S41: YES), the CPU 100 ends the process illustrated in this flowchart, because the power reception control according to the user's intention (the same power reception control as the previous power reception control) has already been performed.

If the CPU 100 determines that the device 10 is not currently operating as the sink (or is currently operating as the source) (step S41: NO), the power reception control according to the user's intention has not been performed. Therefore, the CPU 100 switches the cc terminals connected to the cc line from the pull-up resistors to the pull-down resistors to stop the power supply to the device 20, and enters a power receivable state (or a state in which the device 10 can operate as the sink) (step S42). The CPU 100 then outputs a control signal to the device 20 so that the device 20 supplies electric power to the device 10 (or the device 20 operates as the source) (step S43). As a result, the power transmission direction is changed to the same direction as the previous direction (the direction from the device 10 toward the device 20), so that the power reception control according to the user's intention is performed.

Exemplary embodiments of the present disclosure have been described so far. Embodiments of the present disclosure are not limited to the embodiments described above, and various modifications may be made to those embodiments within the scope of the technical idea of the present disclosure. Embodiments of the present disclosure include embodiments described as examples in the specification, appropriate combinations of obvious embodiments, and the like.

In the above embodiments, the tendencies of consumption of batteries are estimated, with the remaining capacities of the batteries being used as the parameters. However, in some other embodiment, voltage (unit: V), power (unit: W) or the ratio of the remaining capacity to full charge (unit: %) may be used in estimating the tendency of battery consumption, for example.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

The invention claimed is:

1. A power supply device, comprising:
a battery; and
processing circuitry configured to
calculate a rate of change of capacity of the battery per unit time during a target period defined from a first time to a second time so as to determine a tendency of consumption of the battery;
put the power supply device into one of a first state in which the power supply device can supply electric power to another device and a second state in which the power supply device can receive electric power from the other device, based on the determined tendency of consumption of the battery; and
when determining that power to the power supply device is off at a time of connection to the other device, set the second time as a last time the power to the power supply device was on prior to the time of connection, and set the first time as a time a predetermined amount earlier than the second time, so that the target period is defined from the first time to the second time.

2. The power supply device according to claim 1, wherein the processing circuitry is further configured to:
measure a remaining capacity of the battery; and
determine the tendency of consumption of the battery, based on the measured remaining capacity and the calculated rate of change of the capacity of the battery.

3. The power supply device according to claim 2, wherein the processing circuitry is further configured to:
- divide the measured remaining capacity by the calculated rate of change to determine an expected time until the remaining capacity of the battery becomes zero; and
- put the power supply device into one of the first state and the second state based on the determined expected time.

4. The power supply device according to claim 1, wherein the processing circuitry is further configured to:
- communicate with the other device connected to the power supply device, to acquire information about a tendency of consumption of a battery of the other device;
- compare the acquired tendency of consumption of the battery of the other device, with the determined tendency of consumption of the battery of the power supply device; and
- put the power supply device into one of the first state and the second state, based on a result of the comparison made by the processing circuitry.

5. The power supply device according to claim 1,
wherein the processing circuitry is further configured to determine whether the power supply device is reconnected to a same device as a previously connected device,
wherein, when the processing circuitry determines that the power supply device is reconnected to the same device as the previously-connected device, the processing circuitry is further configured to put the power supply device into one of the first state and the second state, the one of the first state and the second state being a same state as a state having been set when the power supply device was connected to the previously-connected device.

6. The power supply device of claim 1, wherein the processing circuitry is further configured to set the second time to be after a time of connection to the other device.

7. A power supply device, comprising:
a battery; and
processing circuitry configured to
- calculate a rate of change of capacity of the battery per unit time during a target period defined from a first time to a second time so as to determine a tendency of consumption of the battery;
- put the power supply device into one of a first state in which the power supply device can supply electric power to another device and a second state in which the power supply device can receive electric power from the other device, based on the determined tendency of consumption of the battery;
- measure a remaining capacity of the battery;
- determine the tendency of consumption of the battery, based on the measured remaining capacity and the calculated rate of change of the capacity of the battery;
- set the target period, including setting the first time and the second time, in accordance with at least an on/off-state of the power supply device and a state of connection to the other device; and
- calculate the rate of change of the capacity of the battery per unit time during the target period set by the processing circuitry.

8. A power supply device, comprising:
a battery; and
processing circuitry configured to
- calculate a rate of change of capacity of the battery per unit time during a target period defined from a first time to a second time so as to determine a tendency of consumption of the battery;
- put the power supply device into one of a first state in which the power supply device can supply electric power to another device and a second state in which the power supply device can receive electric power from the other device, based on the determined tendency of consumption of the battery;
- measure a remaining capacity of the battery;
- determine the tendency of consumption of the battery, based on the measured remaining capacity and the calculated rate of change of the capacity of the battery;
- determine an on/off-state of the power supply device at a time when the other device is connected;
- determine whether the remaining capacity measured is not smaller than a threshold;
- set the target period in accordance with a result of determination; and
- calculate the rate of change of the capacity of the battery per unit time during the target period set by the processing circuitry.

* * * * *